United States Patent
Srinivasan et al.

(10) Patent No.: US 10,949,291 B2
(45) Date of Patent: *Mar. 16, 2021

(54) PARTIALLY WRITTEN SUPERBLOCK TREATMENT

(71) Applicant: Micron Technology, Inc., Boise, ID (US)

(72) Inventors: Dheeraj Srinivasan, San Jose, CA (US); Ali Mohammadzadeh, Mountain View, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/776,600

(22) Filed: Jan. 30, 2020

(65) Prior Publication Data

US 2020/0167229 A1 May 28, 2020

Related U.S. Application Data

(63) Continuation of application No. 15/677,736, filed on Aug. 15, 2017, now Pat. No. 10,552,254.

(51) Int. Cl.
*H03M 7/04* (2006.01)
*H03M 13/05* (2006.01)
(Continued)

(52) U.S. Cl.
CPC ...... *G06F 11/1012* (2013.01); *G06F 11/1068* (2013.01); *G11C 8/12* (2013.01); *G11C 11/5642* (2013.01); *G11C 16/08* (2013.01); *G11C 16/102* (2013.01); *G11C 16/28* (2013.01); *G11C 11/5628* (2013.01); *G11C 16/10* (2013.01); *G11C 29/021* (2013.01);
(Continued)

(58) Field of Classification Search
CPC ............. G06F 11/1012; G06F 11/1068; G11C 2211/5641; G11C 2211/5634; G11C 11/5642; G11C 16/28; G11C 29/028; G11C 8/12; G11C 11/5628; G11C 16/08; G11C 16/10; G11C 16/102; G11C 29/021; H03M 13/37

See application file for complete search history.

(56) References Cited

U.S. PATENT DOCUMENTS 6,581,142 B1 6/2003 Jacobs
7,808,838 B2 10/2010 Kim et al.
(Continued)

*Primary Examiner* — Guy J Lamarre
(74) *Attorney, Agent, or Firm* — Brooks, Cameron & Huebsch, PLLC

(57) ABSTRACT

The present disclosure relates to partially written superblock treatment. An example apparatus includes a memory device operable as a multiplane memory resource including blocks organized as superblocks. The memory device is configured to maintain, internal to the memory device, included in a status of an open superblock, a page indicator corresponding to a last written page of the open superblock. The memory device is further configured, responsive to receipt, from a controller, of a read request to a page of the open superblock, determine from page map information maintained internal to the memory device and from the indicator of the last written page, which of a number of different read trim sets to use to read the page of the open superblock corresponding to the read request.

20 Claims, 8 Drawing Sheets

(51) Int. Cl.
  *H03M 13/09* (2006.01)
  *G06F 11/10* (2006.01)
  *G11C 11/56* (2006.01)
  *G11C 8/12* (2006.01)
  *G11C 16/08* (2006.01)
  *G11C 16/10* (2006.01)
  *G11C 16/28* (2006.01)
  *H03M 13/37* (2006.01)
  *G11C 29/02* (2006.01)

(52) U.S. Cl.
  CPC .... *G11C 29/028* (2013.01); *G11C 2211/5634* (2013.01); *G11C 2211/5641* (2013.01); *H03M 13/37* (2013.01)

(56) References Cited

U.S. PATENT DOCUMENTS

| | | | |
|---|---|---|---|
| 8,111,549 | B2 | 2/2012 | Yip |
| 9,164,830 | B2 | 10/2015 | Kankani et al. |
| 10,388,379 | B2 | 8/2019 | Srinivasan et al. |
| 10,552,254 | B2 * | 2/2020 | Srinivasan ............. G11C 16/28 |
| 2004/0230739 | A1 | 11/2004 | Tsern et al. |
| 2005/0091572 | A1 | 4/2005 | Gavrilescu et al. |
| 2010/0037034 | A1 | 2/2010 | Balakrishnan et al. |
| 2015/0019823 | A1 | 1/2015 | Wang et al. |
| 2015/0227314 | A1 | 8/2015 | Chen et al. |
| 2017/0075593 | A1 | 3/2017 | Kim et al. |

* cited by examiner

| TYPE | READ TRIM |
|------|-----------|
| SLC  | T1        |
|      | T2        |
| MLC1 | T3        |
|      | T4        |
|      | T5        |
| MLC2 | T6        |
|      | T7        |
|      | T8        |
| MLC3 | T9        |
|      | T10       |
|      | T11       |

*Fig. 6*

|  | PLANE 0 | PLANE 1 | PLANE 2 | PLANE 3 |
| --- | --- | --- | --- | --- |
| SUPERBLOCK 0 | 0 | 5 | 6 | 7 |
| SUPERBLOCK 1 | 4 | 9 | 10 | 11 |
| SUPERBLOCK 2 | 8 | 1 | 2 | 3 |
| SUPERBLOCK 3 | 12 | 13 | 14 | 15 |
|  | ... | ... | ... | ... |
| SUPERBLOCK 4 | 500 | 501 | 502 | 503 |
| SUPERBLOCK 5 | 504 | 505 | 506 | 507 |
|  | ... | ... | ... | ... |
| SUPERBLOCK 6 | 808 | 813 | 814 | 815 |
| SUPERBLOCK 7 | 812 | 809 | 810 | 811 |
| SUPERBLOCK 8 | 816 | 817 | 818 | 819 |
|  | ... | ... | ... | ... |

*Fig. 7*

OPEN BLOCK LIST (850)

| BLOCK 0 | LAST WRITTEN PAGE (1) | ENTRY0 |
|---|---|---|
| BLOCK 5 | LAST WRITTEN PAGE (1) | ENTRY1 |
| BLOCK 6 | LAST WRITTEN PAGE (1) | ENTRY2 |
| BLOCK 7 | LAST WRITTEN PAGE (1) | ENTRY3 |

| BLOCK 4 | LAST WRITTEN PAGE (2) | ENTRY0 |
|---|---|---|
| BLOCK 5 | LAST WRITTEN PAGE (1) | ENTRY1 |
| BLOCK 6 | LAST WRITTEN PAGE (1) | ENTRY2 |
| BLOCK 7 | LAST WRITTEN PAGE (1) | ENTRY3 |

*Fig. 8*

OPEN SUPERBLOCK LIST (922)

| BLOCKS 0,5,6,7 | LAST WRITTEN PAGE (1) | ENTRY0 |
|---|---|---|
| BLOCKS 4,9,10,11 | LAST WRITTEN PAGE (2) | ENTRY1 |
| BLOCKS 8,1,2,3 | LAST WRITTEN PAGE (3) | ENTRY2 |
| BLOCKS 12,13,14,15 | LAST WRITTEN PAGE (4) | ENTRY3 |

| ~~BLOCKS 0,5,6,7~~ | ~~LAST WRITTEN PAGE (1)~~ | ~~ENTRY0~~ |
|---|---|---|
| BLOCKS 4,9,10,11 | LAST WRITTEN PAGE (2) | ENTRY1 |
| BLOCKS 8,1,2,3 | LAST WRITTEN PAGE (3) | ENTRY2 |
| BLOCKS 12,13,14,15 | LAST WRITTEN PAGE (4) | ENTRY3 |

*Fig. 9*

SYSTEM CONTROLLER SET FEATURES 1019→  1072, 1032

| FEATURES | OPTIONS | DQ0 | DQ1 | DQ2 | DQ3 | DQ4 | DQ5 | DQ6 | DQ7 |
|---|---|---|---|---|---|---|---|---|---|
| P1 | | | | | | | | | |
| OPEN SUPERBLOCK LIST REMOVAL | NOT ENABLED (DEFAULT) | | | | | | | 0 | 0 |
| | REMOVE SELECTED SUPERBLOCKS FROM OPEN SUPERBLOCK LIST | | | | | | | 0 | 1 |
| | REMOVE ALL SUPERBLOCKS FROM OPEN SUPERBLOCK LIST | | | | | | | 1 | 0 |
| RESERVED | --- | -- | -- | -- | -- | -- | -- | -- | -- |
| P2 | | | | | | | | | |
| OPEN SUPERBLOCK LIST STATUS | READ STATUS OF OPEN SUPERBLOCK LIST (DEFAULT) - ENTRIES AVAILABLE | | | | | | | | 0 |
| | READ STATUS OF OPEN SUPERBLOCK LIST - ALL ENTRIES USED | | | | | | | | 1 |
| RESERVED | --- | -- | -- | -- | -- | -- | -- | -- | |
| P3 | | | | | | | | | |
| OPEN SUPERBLOCK LIST ADDITION | ADD ENTRY TO OPEN SUPERBLOCK LIST | 0 | 0 | 0 | 0 | 0 | 0 | 0 | 1 |
| P4 | | | | | | | | | |
| RESERVED | --- | 0 | 0 | 0 | 0 | 0 | 0 | 0 | 0 |

*Fig. 10*

ID
PARTIALLY WRITTEN SUPERBLOCK TREATMENT

PRIORITY INFORMATION

This application is a Continuation of U.S. Pat. No. 10,552,254, application Ser. No. 15/677,736, filed on Aug. 15, 2017, the contents of which are incorporated herein by reference.

TECHNICAL FIELD

The present disclosure relates generally to semiconductor memory and methods, and more particularly, to partially written superblock treatment.

BACKGROUND

Memory devices are typically provided as internal, semiconductor, integrated circuits in computers or other electronic devices. There are many different types of memory including volatile and non-volatile memory. Volatile memory can require power to maintain its data and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random access memory (RRAM), and magnetoresistive random access memory (MRAM), among others.

Memory devices can be combined together to form a storage volume of a memory system such as a solid state drive (SSD). A solid state drive can include non-volatile memory (e.g., NAND flash memory and NOR flash memory), and/or can include volatile memory (e.g., DRAM and SRAM), among various other types of non-volatile and volatile memory.

An SSD can be used to replace hard disk drives as the main storage volume for a computer, as the solid state drive can have advantages over hard drives in terms of performance, size, weight, ruggedness, operating temperature range, and power consumption. For example, SSDs can have superior performance when compared to magnetic disk drives due to their lack of moving parts, which may avoid seek time, latency, and other electro-mechanical delays associated with magnetic disk drives.

Data being written to memory cells can affect and/or be affected by previously written data (e.g., via cell to cell interference). Accordingly, the charge corresponding to a programmed cell can be affected by whether or not neighboring cells have been programmed and/or by the particular programmed states of neighboring cells. Adjusting read parameters based on the program states of neighboring cells can provide benefits, such as reducing bit error rates and/or reducing latency by preventing read re-tries (e.g., corrective reads), among various other benefits.

BRIEF DESCRIPTION OF THE DRAWINGS

FIG. 6 illustrates a table illustrating a number of different selectable read trim sets corresponding to different programming process page mapping types in accordance with a number of embodiments of the present disclosure.

FIG. 7 illustrates a table illustrating examples of particular blocks of memory cells of a multiplane memory device combined into superblocks in accordance with a number of embodiments of the present disclosure.

FIG. 8 illustrates a table illustrating examples of an open block list, corresponding to at least one superblock, maintained internal to the multiplane memory device in accordance with a number of embodiments of the present disclosure.

FIG. 9 illustrates a table illustrating examples of an open superblock list maintained internal to the multiplane memory device in accordance with a number of embodiments of the present disclosure.

FIG. 10 illustrates a table illustrating an example of a set features interface maintained internal to a host in accordance with a number of embodiments of the present disclosure.

DETAILED DESCRIPTION

Figure 1:
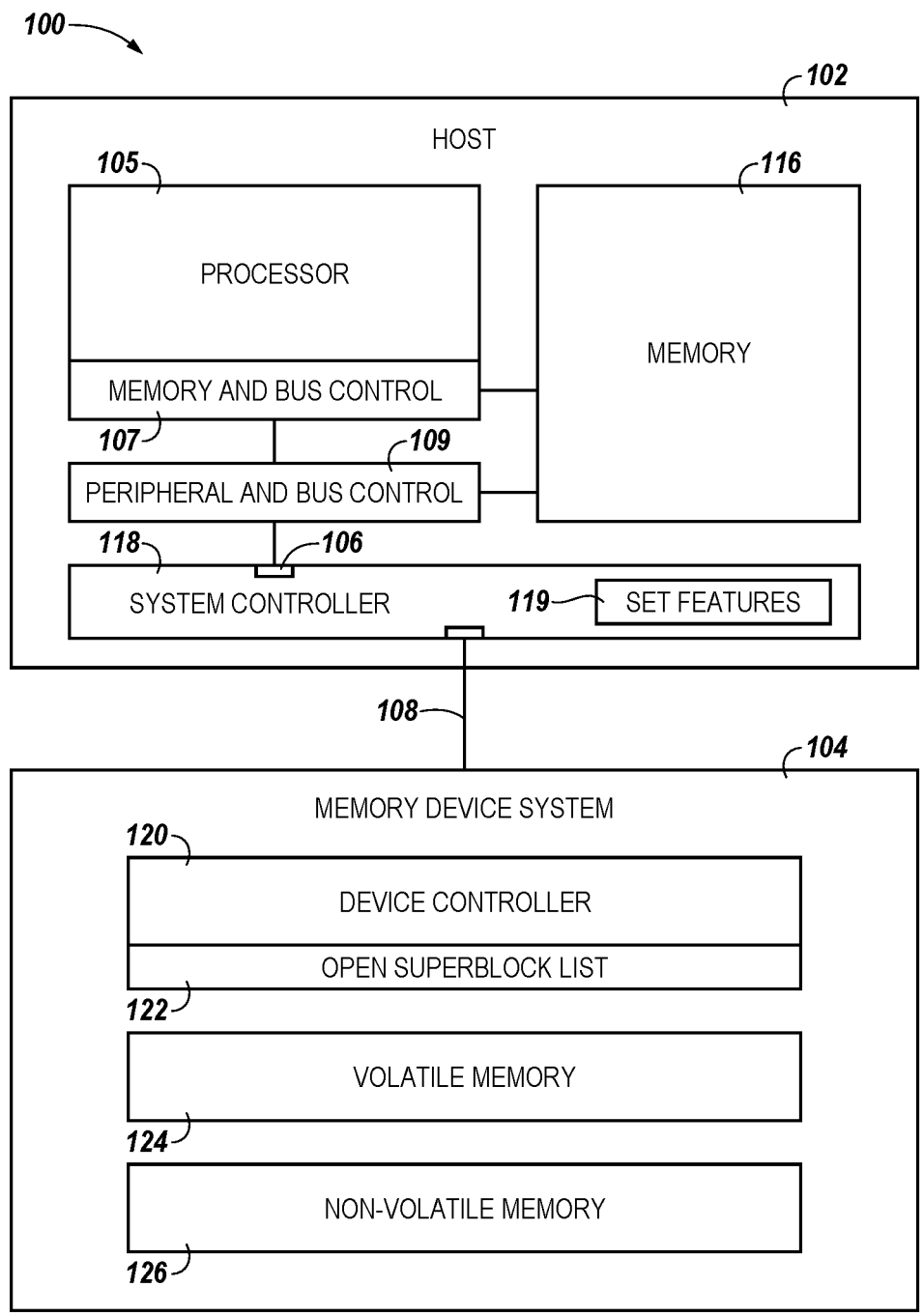
FIG. 1 is a block diagram of an apparatus in the form of a computing system, including at least one memory system, for partially written superblock treatment in accordance a number of embodiments of the present disclosure.

The present disclosure relates to partially written superblock treatment. An example apparatus includes a memory device operable as a multiplane memory resource including blocks organized as superblocks. The memory device is configured to maintain, internal to the memory device, included in a status of an open superblock, a page indicator corresponding to a last written page of the open superblock. The memory device is further configured, responsive to receipt, from a controller, of a read request to a page of the open superblock, determine from page map information maintained internal to the memory device and from the indicator of the last written page, which of a number of different read trim sets to use to read the page of the open superblock corresponding to the read request.

A "superblock" is intended to refer to a group of blocks, with each block in a different plane of a memory device, as described further herein, that are accessed together. In a number of embodiments, a superblock may include a block selected from each of a plurality of planes of the multiplane memory resource. An "open superblock" is intended to mean a partially written superblock, as described further herein. The memory device may be configured to maintain, internal to the memory device, included in the status of a number of open superblocks in the memory device, an indicator of a write operation initiated in a respective number of the open superblocks.

A number of embodiments of the present disclosure may provide benefits such as improving read performance of partially written superblocks, as compared to prior approaches. For instance, treatment of partially written superblocks in accordance with embodiments described herein may reduce uncorrectable bit error rates (UBERs), reduce a number of corrective reads, and also reduce complexity associated with system controllers (e.g., SSD controllers), among various other benefits. As described further herein, a partially written block (e.g., of a partially written superblock) refers to a physical block of memory configured to store a plurality of pages (e.g., logical pages) of data that has not been fully written (e.g., the block and/or superblock is open). In such cases, it may be useful to treat the last written page (e.g., the most recently written page) differently than previously written pages. For example, as described in connection with FIGS. 4 and 5, the last written page may not belong to fully programmed cells (e.g., the cells storing the last written page may be configured to store three logical pages of data with the last written page corresponding to the first or second logical page). As one example, and as described in connection with FIG. 5, the cells may be programmed via a two-pass programming process that includes a first programming pass in which a lower page (LP) and a middle page (MP) are programmed to a group of memory cells, and a second programming pass in which an upper page (UP) is programmed to the group of cells. Additionally, the cells storing a last written page of a partially written block (e.g., of a partially written superblock) do not experience as much cell to cell interference (e.g., due to programming of neighboring cells) as cells storing previously written pages. Therefore, using the same read trim set (e.g., read voltage levels) to perform a read of a last written page of a partially written superblock as is used to perform a read of other pages (e.g., fully written pages) may result in more read errors of the last written pages.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

It is to be understood that the terminology used herein is for the purpose of describing particular embodiments only, and is not intended to be limiting. As used herein, the singular forms "a", "an", and "the" can include both singular and plural referents, unless the context clearly dictates otherwise. In addition, "a number of", "at least one", and "one or more" (e.g., a number of memory arrays) can refer to one or more memory arrays, whereas a "plurality of" is intended to refer to more than one of such things. Furthermore, the words "can" and "may" are used throughout this application in a permissive sense (i.e., having the potential to) being able to, not in a mandatory sense (i.e., must). The term "include," and derivations thereof, means "including, but not limited to". The term "coupled" means to be directly or indirectly connected physically or for access to and movement (transmission) of commands and/or data, as appropriate to the context. The terms "data" and "data values" are used interchangeably herein and can have the same meaning, as appropriate to the context. Additionally, the designators "N", "B", "R", and "S" as used herein, particularly with respect to reference numerals in the drawings, indicates that a number of the particular feature so designated can be included with a number of embodiments of the present disclosure.

The figures herein follow a numbering convention in which the first digit or digits correspond to the figure number and the remaining digits identify an element or component in the drawing. Similar elements or components between different figures may be identified by the use of similar digits. For example, 122 may reference element "22" in FIG. 1, and a similar element may be referenced as 922 in FIG. 9. Multiple analogous elements within one figure may be referenced with a reference numeral followed by a hyphen and another number. For example, 233-1 may reference element 33-1 in FIGS. 2 and 233-2 may reference element 33-2, which can be analogous to element 33-1. Such analogous elements may be generally referenced herein without the hyphen and an extra numeral. For example, elements 233-1 and 233-2 may be generally referenced as 233.

Elements shown in the various embodiments herein can be added, exchanged, and/or eliminated so as to provide a number of additional embodiments of the present disclosure. In addition, the proportion and the relative scale of the elements provided in the figures are intended to illustrate certain embodiments of the present invention, and should not be taken in a limiting sense.

FIG. 1 is a block diagram of an apparatus in the form of a computing system 100, including at least one memory system (e.g., a memory device system 104), for partially written superblock treatment in accordance a number of embodiments of the present disclosure. As used herein, a memory device system 104, a system controller (e.g., 118), a memory device (e.g., 243), or a device controller (e.g., 120) might also be separately considered an "apparatus".

Computing system 100 includes the memory device system 104 (e.g., an SSD) coupled to a host 102 through a device interface 108. As used herein, "coupled to" is intended to refer to a connection between components, which may be an indirect communicative connection or direct communicative connection (e.g., without intervening components), whether wired or wireless, including connections such as, electrical, optical, magnetic, etc. The memory device system 104 may be a solid state storage appliance implemented using a number of SSDs, for example. The computing system 100 may include a controller internal to the memory device system 104 (e.g., device controller 120), in addition to the controller internal to the host (e.g., system controller 118). The device controller 120 may be coupled to a number of memory resources in the memory device system 104 via a number of suitable memory interfaces (not shown). The memory resources may, in a number of embodiments, include a number of SSD memory resources, such as volatile memory devices 124 and/or non-volatile memory devices 126.

Figure 2:
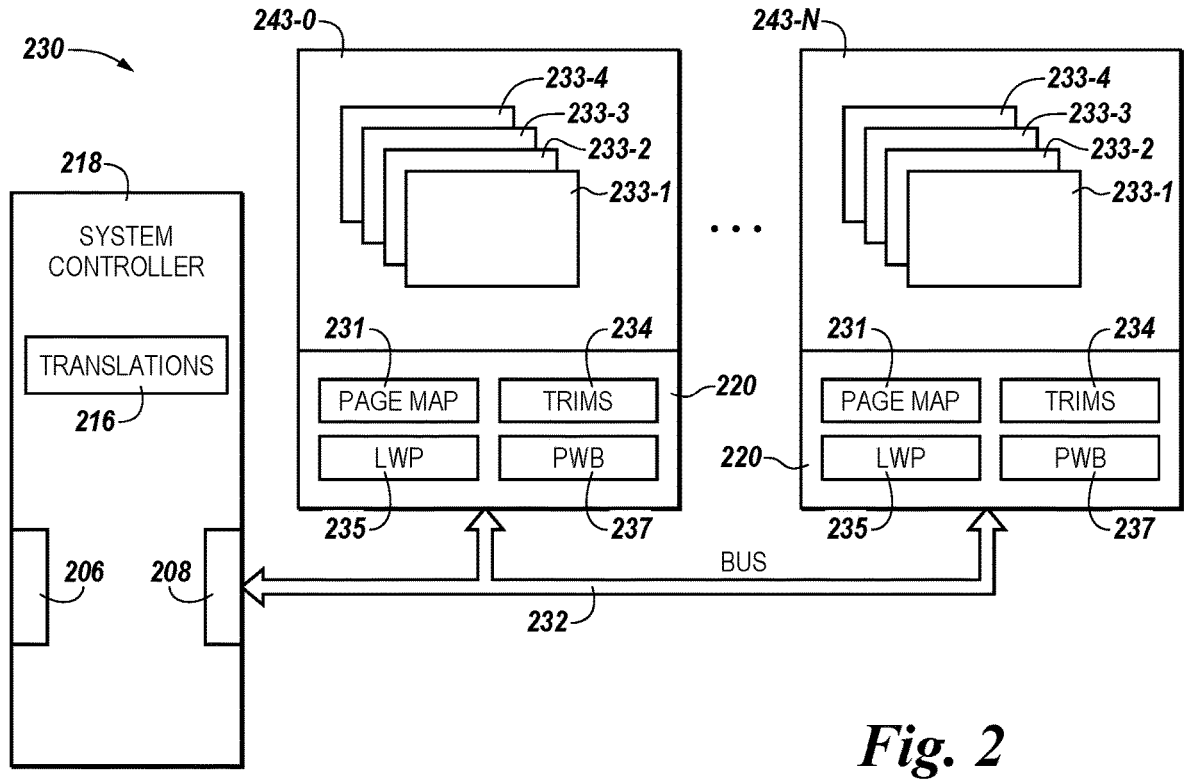
FIG. 2 is a block diagram of an apparatus in the form of a memory system configured to perform partially written superblock treatment in accordance with a number of embodiments of the present disclosure.

As described further in connection with FIG. 2, the computing system 100 (e.g., host 102) may include a system controller (e.g., 218) coupled to a memory (e.g., a number of memory devices 243-1, . . . , 243-N) via a suitable memory interface (e.g., 208). The system controller 218 may be an SSD system controller and at least one of the memory devices may be a NAND Flash memory device including an internal device controller 120. The internal device controller 120, as described herein, may be configured to determine which of a number of different read trim sets to use to read the page of the open superblock corresponding to the read request.

An open superblock list (e.g., 122) may be associated with (e.g., formed as part of) the device controller 120 internal to the memory device system 104. Entries may, in a number embodiments, be stored, until removed (e.g., erased), in the open superblock list (e.g., as shown at 922 and described in connection with FIG. 9).

A number of embodiments of the present disclosure may provide benefits such as improving programming performance (e.g., of write, read, erase, refresh operations, among other possible programming operations performed on memory cells) on groups of memory cells, such as pages, blocks, and/or superblocks, as compared to prior approaches. As described herein, a block (e.g., as shown at 439-1, 439-2, . . . 439-B and described in connection with FIG. 4) may refer to a physical block of memory cells configured to store a plurality of pages (e.g., logical pages) of data that may be part of a combination (e.g., plurality) of blocks in a multiplane memory resource, as described herein.

An "open" block and/or superblock may refer to a physical block or superblock of memory cells in which, responsive to receipt of a request to direct initiation of a programming operation (e.g., a command to initiate a write operation) to a word line coupled to the block in the superblock, an indicator (e.g., an entry) of the initiated programming operation is stored (e.g., as indicated by the partially written superblock being recorded as an entry in and/or at PWS 237 and/or 961) to document that the superblock is open (e.g., in response to the block being opened). In a number of embodiments, the superblock may remain open until a last page in the superblock is programmed, a request (e.g., a write command) is received to direct initiation of a programming operation to a first page of an already programmed superblock, and/or a command is received to remove (e.g., clear, erase, write over) a particular entry for a superblock.

In a number of embodiments, a superblock may refer to a first block in a first plane as a first page group associated with a word line and a second block in a second plane as a second page group associated with the word line in a multiplane memory device. As used herein, terms such as first, second, etc., may be utilized to distinguish one element from a similar element (e.g., the planes of a multiplane memory device) and may not, as appropriate to the context, denote an ordinal sequence of such elements and/or the position of such an element in a sequence of such elements (e.g., recitation of a "first block" may not mean that block is the first block at a beginning or end of a sequence of blocks). In addition, a multiplane memory device may include more than two planes (e.g., four planes as shown at 343-0, 343-2, 343-2, and 343-4 and described in connection with FIG. 3). For example, in a number of embodiments, a multiplane memory device may include 2, 4, 8, 16, etc., planes, among other possible numbers of planes.

The request to direct initiation of the programming operation may, in a number of embodiments, be issued from the host 102 via a host controller (e.g., system controller 118) to a memory device controller (e.g., device controller 120). A set features interface (e.g., 119) may be associated with (e.g., formed as part of) the system controller 118. An embodiment of the set features interface 119 is shown at 1019 and described in connection with FIG. 10.

Example hosts 102 may include laptop computers, personal computers, digital cameras, digital recording and playback devices, mobile telephones, PDAs (personal digital assistants), memory card readers, and interface hubs, among other host systems. A host interface 106 may include a serial advanced technology attachment (SATA), peripheral component interconnect express (PCIe), or a universal serial bus (USB), among other connectors and interfaces for interaction with host components. In general, the host interface 106 in combination with the device interface 108 may provide an interface for passing control, address, data, and other signals between the memory device system 104 and the host 102.

Host 102 may include a number of processors 105 (e.g., parallel processors, co-processors, a central processing unit (CPU), etc.) coupled to a memory and bus control 107. The processor 105 may be a number of microprocessors, or some other type of controlling circuitry, such as a number of application-specific integrated circuits (ASICs), for example. Other components of the computing system 100 also may have processors. The memory and bus control 107 may have memory 116 and/or other components coupled thereto. In this example, memory and bus control 107 is coupled to a host memory 116, which in a number of embodiments may include volatile memory (e.g., DRAM) and/or non-volatile memory (e.g., NAND), among other types of memory. In this example, a peripheral and bus control 109 may be coupled (e.g., via the host interface 106) to the host memory 116, a flash drive (not shown) (e.g., via a universal serial bus (USB) interface), a non-volatile memory host control interface (NVMHCI) flash memory (not shown), and/or the memory device system 104 (e.g., via the system controller 118 and through the device interface 108).

The memory device system 104 may be used in addition to, or in lieu of, a hard disk drive (HDD) in a number of different computing systems. The computing system 100 illustrated in FIG. 1 is one example of such a system; however, embodiments of the present disclosure are not limited to the configuration shown in FIG. 1.

Figure 3:
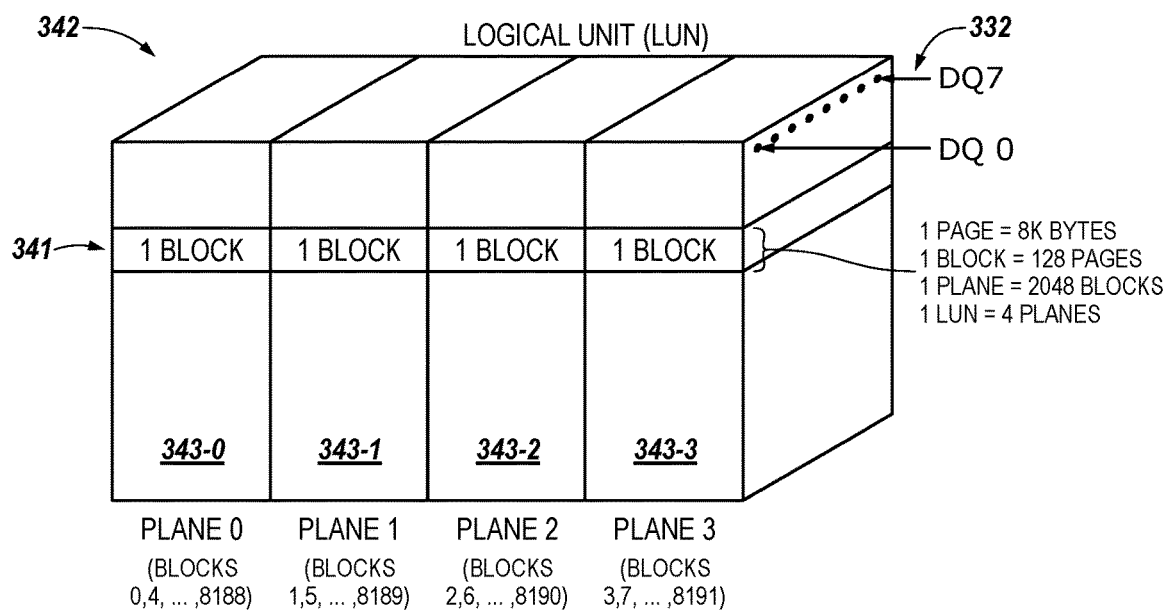
FIG. 3 is a block diagram of an apparatus in the form of a multiplane memory device configured to perform partially written superblock treatment in accordance with a number of embodiments of the present disclosure.

As one example, the memory device system 104 may be an SSD. The memory device system 104 may include the device controller 120 (e.g., memory control circuitry, firmware, and/or software) coupled to a number of memory resources (e.g., volatile memory devices 124 and/or non-volatile memory devices 126) via a bus. An example of an SSD memory resource is described further in connection with FIG. 3. Examples of buses (e.g., pins) for coupling the device controller 120 to a multiplane memory device 342, including a plurality of planes 343, are shown at 232 in FIG. 2 and at 332 and described in connection with FIG. 3 (e.g., as data (DQ) buses DQ 0, DQ 1, . . . , DQ 7, although the number of such DQ buses are not limited to 8 I/O lines). The multiplane memory device 342 with the DQ buses 332 shown in FIG. 3 is presented by way of example; however, embodiments of the present disclosure are not limited to these examples of buses.

The system controller 118 includes the host interface 106 for communication with the host 102 and a device interface 108 for communication with a memory system as shown at 230 and described in connection with FIG. 2 and/or the multiplane memory device 342 just described, via the buses 232 and/or 332, among other possibilities, in the volatile memory resources 124 and/or non-volatile memory resources 126. Various buses also may send and/or receive various signals (e.g., data signals, control signals, and/or address signals, among others) between the memory device system 104 and/or the device controller 120 thereof and the system controller 118.

Although the example illustrated in FIG. 1 includes a single device interface 108 serving as a bus, the memory device system 104 may include separate data buses (DQ buses), a control bus, and/or an address bus. Such buses may have various types of bus structures including, but not limited to, bus structures related to Open NAND Flash Interface (ONFI), Compact Flash Interface, Multimedia Card (MMC), Secure Digital (SD), CE-ATA, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI). The system controller 118 may be configured to support various data interface types associated with the memory device system 104 (e.g., NV-DDR, NV-DDR2, NV-DDR3, etc.).

The system controller 118 may include, in a number of embodiments, a translation component to execute translations (e.g., as shown at 216 and described in connection with FIG. 2), which may be a flash translation layer (FTL), for example, associated with logical to physical address translation between the host 102 and memory device system 104. For instance, the translation component 216 may include a mapping table of logical block addresses (LBAs) to physical block addresses (PBAs). The pages, blocks, planes, superblocks, and/or associated word lines described herein also may be mapped from logical addresses to physical addresses (e.g., by the device controller 120). For example, statuses of the superblocks 746 and 961, blocks 851, and planes 745 shown as documented in tables and described in connection with FIGS. 7-9 may each include a link to the physical addresses thereof, in combination with an address to each of the word lines with which they are associated (e.g., coupled). For example, last written page indicators shown at 852 and 962 and described in connection with FIGS. 8 and 9, respectively, may each include a physical addresses of the last written page and/or a link to the physical addresses thereof, in combination with an address to each of the word lines. Although not shown in FIG. 1, device controller 120 may also include various other components implemented in hardware, firmware, and/or software and associated with management of memory device system 104.

FIG. 2 is a block diagram of an apparatus in the form of a memory system 230 configured to perform partially written superblock treatment in accordance with a number of embodiments of the present disclosure. As one example, the memory system 230 may be a solid state drive (SSD). The memory system 230 includes a memory system controller 218 (e.g., memory control circuitry, firmware, and/or software) coupled to a memory (e.g., a number of memory devices 243-1, . . . , 243-N) via a bus 232. The memory devices 243-1, . . . , 243-N may be referred to collectively as memory devices 243 or as memory 243. In a number of embodiments, the memory devices 243-1, . . . , 243-N shown in FIG. 2 may correspond to the planes (e.g., as shown at 343-0, 343-2, 343-2, and 343-4 and described in connection with FIG. 3) of a multiplane memory device 342.

The system controller 218 includes a host interface 206 for communication with a host such as host 102 described in FIG. 1, and a device interface 208 for communication with the memory devices 243 via a bus 232. The bus 232 may send and/or receive various signals (e.g., data signals, control signals, and/or address signals) between the memory devices 243 and the system controller 218. Although the example illustrated in FIG. 2 includes a single bus 232, the memory system 230 may include separate data buses (DQ buses), as shown at 332 and described in connection with FIG. 3, a control bus, and an address bus, among other possible buses. The bus 232 may have various types of bus structures including, but not limited to, bus structures related to Open NAND Flash Interface (ONFI), Compact Flash Interface, Multimedia Card (MMC), Secure Digital (SD), CE-ATA, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI). The system controller 218 may be configured to support various data interface types associated with the memory devices 243 (e.g., NV-DDR, NV-DDR2, NV-DDR3, etc.).

The system controller 218 includes the translation component 216, which may be a flash translation layer (FTL), for example, associated with logical to physical address translation between the host and memory 243. For instance, the translation component 216 may include a mapping table of logical block addresses (LBAs) to physical block addresses (PBAs). Although not shown in FIG. 2, system controller 218 also may include an error detection and/or correction component, a wear leveling component, and/or a garbage collection component, among various other components implemented in hardware, firmware, and/or software and associated with management of memory 243.

As illustrated in FIG. 2, the memory devices 243 may include a number of memory units 233-1, 233-2, 233-3, and 233-4, which may be referred to collectively as memory units 233 and which provide a storage volume for the memory system 230. The memory units 233 may be dies or chips, which may be referred to as logical units (LUNs). For example, the memory devices 243 may be multi-chip packages (MCPs) that each includes a number of dies 233. The dies 233 may be, for example, NAND dies including a number of arrays of NAND flash memory cells and associated peripheral circuitry (e.g., write circuitry, read circuitry, I/O circuitry, buffers, etc.).

As described further below in connection with FIGS. 3 to 5, the arrays may be NAND flash arrays including single level cells (SLCs) configured to store a single data unit (e.g., one bit), and/or multilevel cells (MLCs) configured to store more than one data unit. Additionally, the cells may be programmable via various different programming processes, which may depend on the quantity of data units stored per cell; however, cells configured to store a particular quantity of data units (e.g., 2 bits, 3 bits, 4 bits, etc.) per cell may be programmable via different programming processes. For example, a 3-bit MLC might be programmable via a two-pass programming process (e.g., a 4-8 process in which a first programming pass places the threshold voltage of the cells from an erase state into one of four distributions based on a lower page and middle page data state and in which a second programming pass places the threshold voltage of the cells from the one of four distributions into one of eight distributions based on the upper page data state), or a three-pass programming process (e.g., a 2-4-8 process).

Embodiments, as described herein, are not limited to the example shown in FIG. 2. For instance, memory systems in accordance with a number of embodiments may include more or fewer than four memory units (e.g., die) 233 per memory device (e.g., MCP) 243 and are not limited to a particular memory array architecture (e.g., NAND flash, NOR flash, DRAM, PCM, etc.). Also, although one controller 220 is shown per device 243, embodiments may include a controller per memory unit 233 (e.g., one controller per NAND die).

The memory devices 243 of system 230 include an internal device controller 220 configured to control operations (e.g., read, program, erase, etc.) performed on the memory units 233 (e.g., responsive to commands from system controller 218 and/or from a host via system controller 218). The controllers 220 are local to the memory devices 243 and may communicate with the external system controller 218 via bus 232. As shown in FIG. 2, the internal device controllers 220 may use internally stored page map information 231, read trim set information 234, last written page (LWP) information 235, and partially written superblock (PWS) information 237, which may be used in association with partially written page treatment in accordance with embodiments described herein.

As an example, the information 231, 234, 235, and 237 may be stored (e.g., as tables) in memory in association with (e.g., located on) controller 220 and/or in the arrays of memory units 233. In a number of embodiments, maintaining the information 231, 234, 235, and/or 237 local to memory devices 243 may provide various benefits such as reducing the involvement of the system controller 218 in association with effectively reading partially written superblocks as compared to previous approaches.

For example, various previous approaches might involve the system controller sending a read request to a partially written superblock, receiving an uncorrectable error, and then re-reading the page corresponding to the read request with an adjusted read trim set (e.g., via a corrective read). Such corrective reads may adversely affect latency. Other previous approaches to treating partially written superblocks might involve the system controller 218 tracking which blocks of memory 233 are partially written as well as the last written page of the block, and the status of neighboring pages, which may have drawbacks such as increasing the complexity of the system controller (e.g., due to large table sizes, etc.).

As an example, the page map information 231 may include a programming order of pages written to the blocks. The programming order may include page numbers and may be used to determine the location of a particular page corresponding to a read request with respect to the page last written to the block. The last written page 235 information may provide a status of pages last written to partially written superblocks, which may include identifiers (e.g., page numbers) of the last written pages and may also indicate a completion status of the last written page (e.g., whether the page belongs to a group of partially programmed cells, or whether the page is fully programmed). The last written page 235 information may be maintained on a per superblock basis (e.g., such that it includes the last written page information corresponding to all the individual partially written superblocks). The completion status of the last written page may also be determined (e.g., by the controller 220) based on the page number of the last written page and the page map information 231. The partially written block information 237 may provide identifiers (e.g., block numbers) in partially written superblocks (e.g., those blocks not yet programmed to completion). The read trim set information 234 may include different read trim sets used to read pages of data responsive to read requests. As an example, a first read trim set may be used to read pages written to cells that are not adjacent to cells to which the last written page was written, a second read trim set may be used to read pages written to cells adjacent to unwritten cells, and a third read trim set may be used to read pages written to cells that are adjacent to partially written cells.

Accordingly, the status of the last written page 235 being maintained internal to the memory device may include a page number corresponding to the last written page and the page map information 231 may include a programming order of pages written to the open superblock. The page map information 231 maintained internal to the memory device may correspond to a number of different programming process page mappings including at least two different two-pass programming process page mappings.

Which of the number of different read trim sets (e.g., as shown at 634 and described in connection with FIG. 6) to use to read the page of the open superblock may be determined based on at least one of: whether memory cells to which the page is written are fully programmed and a programming status of memory cells coupled to an access line (e.g., word line) adjacent to and/or near an access line to which the page is written (e.g., to determine the status of pages neighboring the page of the open superblock to be read).

In operation, memory device 243 may receive a write command (e.g., from system controller 218) that results in a particular block and/or superblock being partially written. The memory device 243 may store, internally, an indicator that the particular block and/or superblock is partially written (e.g., open) as well as an indicator of the last written page of the open block and/or superblock. Prior to the remainder of the particular block and/or superblock being written, the memory device 243 may receive a read request (e.g., from system controller 218), which may include a superblock identifier (e.g., a particular physical superblock address as shown at 961 and described in connection with FIG. 9) and a page identifier (e.g., a physical page number) associated with a requested page of data. The memory device 243 (e.g., via internal controller 220) may compare the received superblock identifier to the partially written block information 237 (e.g., including the partially written superblock information) to determine whether the read request corresponds to a partially written superblock. Responsive to determining that the block identifier matches (e.g., that the read request corresponds to a partially written superblock), the internally stored page map information 231 and internally stored last written page information 235 may be used (e.g., by the internal controller 220) to determine which particular read trim set 234 to select for reading the requested page (e.g., the page corresponding to the read request). In a number of embodiments, the memory device 243 may execute the read request corresponding to the partially written superblock using the appropriate read trim set (e.g., a selected one of the different read trim set shown at 634 and described in connection with FIG. 6) without further interaction with the system controller 218.

In a number of embodiments, the system controller 218 (e.g., associated with and/or part of host 102) may be unaware of the status of the last written page corresponding to the partially written superblock when sending the read request to the memory device 243. The read request sent to the memory device 243 may include an identifier of each block of the open superblock (e.g., as shown at 961 and described in connection with FIG. 9) and a page identifier (e.g., physical address) of the page to be read. The memory device 243 may access the page map information 231 maintained internal to the memory device and the indicator of the last written page 234, 962 responsive to determining that the page identifier corresponds to a block included in the identifier 961 of each block of the open superblock.

The system controller 218 may be an external controller that may be unaware that the read request corresponds to an open superblock. The system controller 218 may be an external controller that is coupled to the host 102 via a host interface 106 and that is coupled to the memory device 243 via a device interface 108 to a memory device system 104. The read request may be sent (e.g., via the device interface 108) to the memory device 243 of the memory device system 104 responsive to a host-initiated read request corresponding to a particular logical block address and the particular logical block address may be translated (e.g., using the translation component 216 associated with the host 102) to a physical block address prior to the read request being sent to the memory device 243.

For instance, the system controller 218 may be unaware that the requested page is a last written page of a partially written superblock. The read request sent from system controller 218 to memory device 243 may be responsive to a host-initiated read request corresponding to a particular LBA, and the system controller 218 may translate (e.g., via translation component 216) the LBA to a physical block address prior to sending the read request to the device 243. In a number of embodiments, the system controller 218 may be configured to maintain a "shadow" copy of partially written superblocks and/or last written pages within partially written superblocks (e.g., such that system controller 218 and/or the controller 220 internal to the memory device system 104 and associated with the memory device 243 may maintain such information). In a number of embodiments, the system controller 218 may issue a command to the memory device 243 to read partially written superblock and/or last written page information from the device 243, which may enable the information to persist across power cycles, for example.

FIG. 3 is a block diagram of an apparatus in the form of a multiplane memory device 342 configured to perform partially written superblock treatment in accordance with a number of embodiments of the present disclosure. The multiplane memory device 342 illustrated in FIG. 3 shows an example of a four plane memory device (e.g., plane 0, plane 1, plane 2, and plane 3 as shown at 343-0, 343-1, 343-2, and 343-3, although embodiments may include 2, 4, 8, 16, etc., planes) that may, in a number of embodiments, be utilized for performance of partially written superblock treatment. A combination of the plurality of planes of the multiplane memory device 342 may be termed a logical unit (LUN). The multiplane memory device 342 may be configured as a volatile memory resource (e.g., DRAM, among other volatile memory device configurations) or as a non-volatile memory resource (e.g., NAND, among other non-volatile memory device configurations). For clarity, the multiplane memory device 342 illustrated in FIG. 3 is described below in the non-volatile NAND configuration.

In a number of embodiments, the LUN 342 may provide a storage volume for the memory device system 104 shown and described in connection with FIG. 1. The planes 343 may be dies or chips, which when combined may be referred to as the LUN 342. For example, the planes 343 may be multi-chip packages (MCPs) that each includes a number of dies. The dies may be, for example, NAND dies that include a number of arrays of NAND flash memory cells and associated peripheral circuitry (e.g., write circuitry, read circuitry, I/O circuitry, buffers, etc.).

As described in connection with FIG. 1, the LUN 342 illustrated in FIG. 3 may include a number of buses 332 (e.g., data buses DQ 0, DQ 1, ..., DQ 7) for coupling to the device controller 120 internal to the memory device system 104 (e.g., for input and/or output of programming operations as directed, via the device interface 106, by the system controller 118 internal to the host 102). Each of the memory planes 343 may, in a number of embodiments, include a plurality of blocks, as described herein. As one example, a single block (e.g., 341) in each plane may include 128 pages associated with a number of word lines (not shown). In this example, 16 pages each associated with a single word line, with each word line coupled to a single bus (e.g., eight buses 332 in FIG. 3), yields 128 pages for a single block 341 in each plane 343. In a number of embodiments, each page may have a data storage capacity of 8192 (8K) bytes and each plane 343 of the LUN 342 may have 2048 (2K) blocks. As illustrated in FIG. 3, the combination of the planes of the LUN may include 8192 (8K) blocks (4 planes times 2048 blocks per plane equals 8192 blocks); however, embodiments of the present disclosure are not limited to the configuration shown in FIG. 3.

The system controller 118 and/or the device controller 120 may address a combination of the blocks (along with the pages therein) of the LUN 342 as a single unit (e.g., a superblock, as shown at 746 and described in connection with FIG. 7). For example, for the four plane LUN 342 shown in FIG. 3 to include 8192 blocks, plane 0 at 343-0 may include blocks 0, 4, ..., 8188, plane 1 at 343-1 may include blocks 1, 5, ..., 8189, plane 2 at 343-2 may include blocks 2, 6, ..., 8190, and plane 3 at 343-3 may include blocks 3, 7, ..., 8191. Hence, as one example, a superblock may be addressed at block 0, block 1, block 2, and block 3, in corresponding planes 0, 1, 2, and 3, for performance of a programing operation and/or for partially written superblock treatment (e.g., as defined by the blocks in an address of a superblock, as shown at 961 and described in connection with FIG. 9).

Each word line described in connection with FIG. 3 may be coupled to a bus 332. In a number of embodiments, each bus may be coupled to one or more word lines. For example, a plurality of word lines per bus 332 may be oriented vertically (e.g., stacked) in each block 341 of each plane 343 to form a multiple of the number of buses (e.g., eight in FIG. 3) times the number of the plurality of word lines per bus 332 as the number of word lines per block 341.

In the example shown in FIG. 3, each block 0, 1, ..., 8191 and/or superblock formed from a block from each of blocks 0, 1, 2, and 3 includes memory cells which may be erased together as a unit (e.g., the cells in each physical block may be erased in a substantially simultaneous manner as an erase unit). Each block may include a number of physical rows of memory cells that may each be coupled to a respective word line (e.g., access line). The number of rows in each block may be 32, 64, or 128, although embodiments are not limited to a particular number of rows, which may be referred to collectively as rows per block.

Each row coupled to a word line may include a number of physical pages of cells. A physical page of cells may refer to a number of memory cells that may be programmed and/or written together or as a functional group. For instance, each row may include multiple physical pages of cells (e.g., an even page associated with cells coupled to even-numbered bit lines, and an odd page associated with cells coupled to odd numbered bit lines). Additionally, for embodiments including multilevel cells, a physical page may store multiple logical pages of data with each cell in a physical page contributing a bit toward a logical lower page, a bit toward a logical upper page, and one or more bits toward a respective number of logical intermediate pages.

The NAND memory devices described as example memory resources for the memory device 230 illustrated in FIG. 2 and/or the LUN 342 illustrated in FIG. 3 may, in a number of embodiments, include NAND dies (e.g., NAND flash arrays) that have single level cells (SLCs) configured to store a single data unit (e.g., one bit), and/or multilevel cells (MLCs) configured to store more than one data unit. Additionally, the cells may be programmable via various different programming processes, which may depend on the quantity of data units stored per cell; however, cells configured to store a particular quantity of data units (e.g., 2 bits, 3 bits, 4 bits, etc.) per cell may be programmable via different programming processes. For example, a 3-bit MLC might be programmable via a two-pass programming process (e.g., a 4-8 process, as shown and described in connection with FIG. 5, in which a first programming pass places the threshold voltage of the cells from an erase state into one of four distributions based on a lower page and middle page data state and in which a second programming pass places the threshold voltage of the cells from the one of four distributions into one of eight distributions based on the upper page data state), or a three-pass programming process (e.g., a 2-4-8 process).

Embodiments of the present disclosure are not limited to the example shown in FIG. 3. For instance, memory systems in accordance with embodiments described herein may include more or fewer than four planes 343 per LUN 342 and are not limited to a particular memory array architecture (e.g., NAND, NOR, DRAM, PCM, etc.). In addition, although one device controller 120 is shown per memory device system in FIG. 1, embodiments may include a device controller 120 per memory device 230 in FIG. 2 and/or a device controller 120 per LUN 342 or plane 343 thereof in FIG. 3 (e.g., one controller per NAND die).

The memory devices 230 and/or 342, along with device controller 120, of memory device system 104 are configured to track and/or control programming operations (e.g., write operations). In a number of embodiments, the device controller 120 (e.g., in combination with an associated open superblock list shown at 922 and described in connection with FIG. 9) may maintain, internal to the memory device system 104, a status of a number of open superblocks in the memory devices.

The system controller 118 may, in a number of embodiments, be coupled to the host 102 (e.g., components of the host, as described herein) via the host interface 106 and further coupled to a number of memory devices (e.g., internal to the memory device system 104) via the device interface 108. The system controller 118 may be configured to direct initiation of a write operation to a page of a block associated with a word line. An example memory device (e.g., as shown at 230 and/or 342) may include a plurality of blocks configured to store pages of data in a superblock. The memory device may be configured to maintain, internal to the memory device, a status of a last written page corresponding to a partially written superblock. The memory device may be further configured, responsive to receipt, from a controller (e.g., system controller 118), of a read request to a page of the open superblock, to determine from page map information (e.g., 231) maintained internal to the memory device and from an indicator of a last written page (LWP) (e.g., 235), which of a number of different read trim sets (e.g., 234) to use to read the page of the open superblock corresponding to the read request.

The memory device may be further configured to maintain, internal to the memory device, a status of a number of partially written superblocks (PWS) (237) in the memory device. The status may include an indicator (e.g., as indicated by the partially written superblock being recorded as an entry in and/or at PWS 237 and/or 961) of a write operation being initiated in a respective number of open superblocks (e.g., as shown at 961 and described in connection with the open superblock list 922 in FIG. 9). The memory device may be further configured to maintain, included in the status of an open superblock, a page indicator corresponding to the last written page of the open superblock (e.g., as shown at 962 in the open superblock list 922). In a number of embodiments, each page indicator may include a physical address of the last written page, a link to the physical address thereof, and/or an address of the corresponding word line. The memory device may be further configured, responsive to receipt from the controller of a read request to a page of the open superblock, to determine from page map information 231 maintained internal to the memory device and from the indicator of the LWP 234, which of the number of different read trim sets 234, 634 to use to read the page of the open superblock corresponding to the read request.

In contrast to the device controller 120, the system controller 118, in a number of embodiments, may not be configured to track open superblocks corresponding to pages of the memory device. The system controller 118 also may not be configured to update the status of an open superblock to include an indicator (e.g., a physical address and/or a link to the physical address) of a last written page for the open superblock (e.g., as shown at 961 and described in connection with FIG. 9). In further contrast to the device controller 120, the system controller may include a set features interface (e.g., as shown at 119 in FIGS. 1 and 1019 in FIG. 10) configured to direct removal of an entry 1073 in the open superblock list 922 maintained internal to the memory device. Each entry may include an indicator of a last written page programmed for the open superblock.

The internal device controller 120, in contrast to the system controller 118, may be configured to track open superblocks corresponding to pages of the memory device. In further contrast to the system controller 118, the device controller 120 may be configured to dynamically update the indicators of the last written page for tracked open superblocks.

The write request (e.g., from the system controller 118) may, in a number of embodiments, include a superblock identifier and/or a page identifier (e.g., physical addresses of the superblock and/or page for direction of the write operation). However, the system controller 118 may be unaware of whether the superblock identifier corresponds to an open block when sending the write request. In contrast, the status of a particular superblock being open may be documented by being an entry of a block 851 in the open block list 850 and/or of a superblock 961 in the open superblock list 922 associated with the device controller 120.

The system controller 118 coupled to the host 102 may, in a number of embodiments, be a system SSD controller that may be further coupled, via a bus (e.g., device interface 108), to an internal SSD device controller (e.g., operating as the device controller 120) of the memory device. The memory device in the memory device system 104 coupled to the internal SSD device controller may, in a number of embodiments, be a number of SSDs configured as a volatile memory resource (e.g., as shown at 124 and described in connection with FIG. 1 and elsewhere herein) and/or as a non-volatile memory resource (e.g., as shown at 126 and described in connection with FIG. 1 and elsewhere herein).

An example of a non-volatile memory resource may be configured as a non-volatile multiplane memory resource (e.g., LUN 342 described in connection with FIG. 3). The multiplane memory resource may be configured to form a superblock (e.g., superblocks 746 described in connection with FIG. 7) that may each include a plurality of planes 745. An example of a superblock may include a first block in a first plane (e.g., plane 1) as a first page group associated with a word line and a second block in a second plane (e.g., plane 2) as a second page group associated with the word line. The first block in the first plane and the second block in the second plane may perform write operations concurrently as directed by the SSD controller internal to the memory device system.

Figure 4:
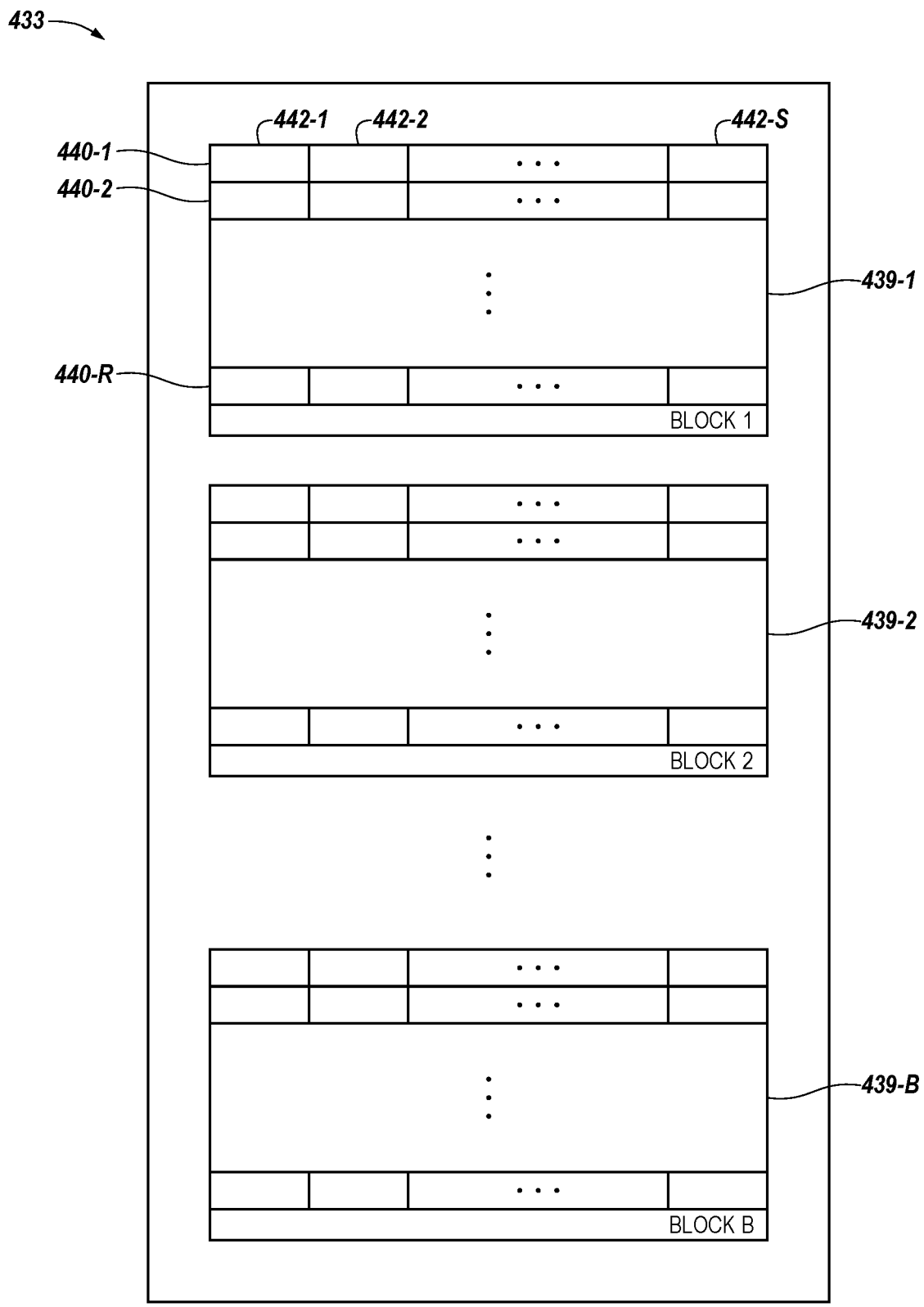
FIG. 4 illustrates an example of a memory unit having groups of memory cells organized as a number of physical blocks in accordance with a number of embodiments of the present disclosure.

FIG. 4 illustrates an example of a memory unit 433 having groups of memory cells organized as a number of physical blocks 439-1 (BLOCK 1), 439-2 (BLOCK 2), . . . , 439-B (BLOCK B), in accordance with a number of embodiments of the present disclosure. The memory unit 433 may be a memory unit such as memory units 233 described in connection with FIG. 2. The memory cells of memory unit 433 may, for example, be non-volatile floating gate flash memory cells having a NAND architecture. However, embodiments of the present disclosure are not limited to a particular memory type.

The memory blocks 439-1, 439-2, . . . , 439-B may be referred to collectively as blocks 439 and may include SLC and/or MLC cells, for instance. As an example, the number of physical blocks in an array of memory unit 433 may be 128 blocks, 512 blocks, or 1,024 blocks, although embodiments are not limited to a particular number of physical blocks.

In the example shown in FIG. 4, each physical block 439 includes memory cells which may be erased together as a unit (e.g., the cells in each physical block may be erased in a substantially simultaneous manner as an erase unit). As shown in FIG. 4, each physical block 439 includes a number of physical rows 440-1, 440-2, . . . , 440-R of memory cells that may each be coupled to a respective word line (e.g., access line). The number of rows in each physical block may be 32, 64, or 128, although embodiments are not limited to a particular number of rows, which may be referred to collectively as rows 440, per block 439.

Each row 440 may include a number of physical pages of cells. A physical page of cells may refer to a number of memory cells that are programmed and/or read together as a functional group. In the embodiment shown in FIG. 4, each row 440 may include one physical page of cells. However, embodiments of the present disclosure are not so limited. For instance, each row 440 may include multiple physical pages of cells (e.g., an even page associated with cells coupled to even-numbered bit lines, and an odd page associated with cells coupled to odd numbered bit lines). Additionally, as described further in connection with FIG. 5, for embodiments including multilevel cells, a physical page may store multiple logical pages of data with each cell in a physical page contributing a bit toward a logical lower page, a bit toward a logical upper page, and one or more bits toward a respective number of logical intermediate pages.

In the example shown in FIG. 4, a physical page corresponding to a row 440 may store a number of sectors 444-1, 444-2, . . . , 444-S of data (e.g., an amount of data corresponding to a host sector, such as 512 bytes). The sectors 444 may include user data as well as overhead data, such as error correction code (ECC) data and logical block address (LBA) data. Other configurations for the physical blocks 439, rows 440, and sectors 444 are possible. For example, rows 440 may each store data corresponding to a single sector which may include, for example, more or less than 512 bytes of data.

Figure 5:
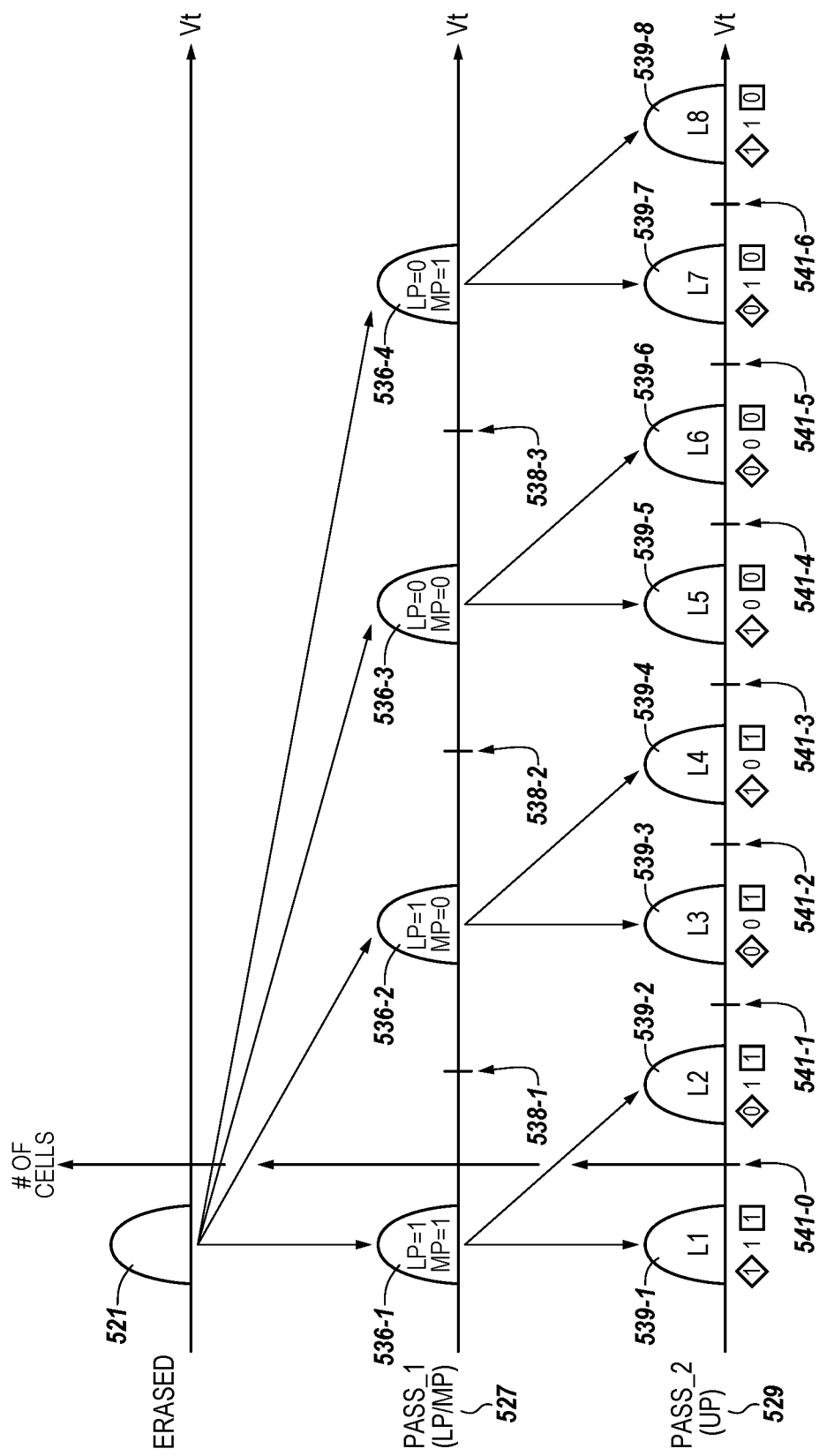
FIG. 5 illustrates a diagram associated with programming memory cells in accordance with a number of embodiments of the present disclosure

FIG. 5 illustrates a diagram associated with programming memory cells in accordance with a number of embodiments of the present disclosure. In this example, the memory cells are 3-bit MLCs each being programmable to one of eight data states (e.g., L1 to L8) assigned a different respective 3-bit bit pattern (e.g., 111, 011, 001, 101, 100, 000, 010, and 110). In a number of embodiments, each of the bits in the 3-bit stored bit patterns corresponds to a different logical page of data. For instance, the least significant bit (LSB) (right most bit shown as boxed in FIG. 5) may correspond to a first page of data (e.g., a lower page), the middle bit may correspond to a second page of data (e.g., a middle page), and the most significant bit (MSB) (left most bit as indicated by a diamond symbol in FIG. 5) may correspond to a third page of data (e.g., an upper page).

However, embodiments are not limited to multilevel memory cells storing three bits of data. For instance, a number of embodiments may include memory cells configured to store more or fewer than three bits of data and/or a fractional number of bits of data per cell, and embodiments are not limited to the particular encoding assigned to the data states L1 to L8.

The diagram shown in FIG. 5 illustrates threshold voltage (Vt) distributions associated with programming memory cells (e.g., NAND flash cells) in accordance with a two-pass programming process (e.g., a 4-8 two-pass programming process) that includes a first programming pass (PP_1) 527 by which the lower page and middle page (LP/MP) are programmed, and a second programming pass (PP_2) 529 by which the upper page (UP) is programmed.

Threshold voltage (Vt) distribution 521 represents erased memory cells. The first programming pass 527 includes adjusting the Vt of the memory cells (e.g., via programming pulses applied to a selected word line) to one of four levels represented by Vt distributions 536-1, 536-2, 536-3, and 536-4. The voltage levels are represented by Vt distributions, which may reflect a statistical average Vt level of cells programmed to a particular level. In this example, cells whose lower page is to store a bit value of "1" (e.g., LP=1) and whose middle page is to store a bit value of "1" (e.g., MP=1) are programmed to distribution 536-1 during the first programming pass 527, cells whose lower page is to store a bit value of "1" (e.g., LP=1) and whose middle page is to store a bit value of "0" (e.g., MP=0) are programmed to distribution 536-2 during pass 527, cells whose lower page is to store a bit value of "0" (e.g., LP=0) and whose middle page is to store a bit value of "0" (e.g., MP=0) are programmed to distribution 536-3 during pass 527, and cells whose lower page is to store a bit value of "0" (e.g., LP=0) and whose middle page is to store a bit value of "1" (e.g., MP=1) are programmed to distribution 536-4 during pass 527.

The second programming pass 529 includes adjusting the Vt of the memory cells (e.g., via programming pulses applied to a selected word line) to one of eight levels represented by Vt distributions 539-1 to 539-8, which correspond to data states L1 to L8, respectively, with each one of data states L1 to L8 indicating a different 3-bit stored bit pattern. In this example, cells programmed to data state L1 store data "111," cells programmed to data state L2 store data "011," cells programmed to data state L3 store data "001," cells programmed to data state L4 store data "101," cells programmed to data state L5 store data "100," cells programmed to data state L6 store data "000," cells programmed to data state L7 store data "010," and cells programmed to data state L8 store data "110."

The diagram illustrated in FIG. 5 illustrates a number of read voltages 541-0, 541-1, 541-2, 541-3, 541-4, 541-5, and 541-6 (referred to generally as read voltages 541) associated with reading the bits of the three respective stored pages. A number of read strobes (e.g., using a number of the read voltages 541 applied to the selected word line) may be required in association with a reading a particular page of data. For instance, in this example, the encoding is such that a single read strobe (e.g., at read voltage 541-3) may be used to determine whether the lower page of the cell is a "0" or a "1" (e.g., a single Vt detection operation using read voltage 541-3). Also, in this example, two read strobes must be performed in order to decode the middle page (e.g., one strobe at read voltage 541-1 and one strobe at read voltage 541-5). Also, in this example, the encoding is such that four read strobes must be performed in order to decode the upper page (e.g., strobes at read voltages 541-0, 541-2, 541-4, and 541-6). However, in instances in which the first programming pass 527 has been performed but the second programming pass 529 has not been performed, it may be beneficial to use different read voltages to read the lower and middle pages than those read voltages (e.g., 541) used to read the lower and middle pages when the upper page has also been programmed. For example, if it is determined that the second programming pass 529 has not been performed, reading the lower page using read voltage 541-2 may result in fewer bit errors that using read voltage 541-3.

FIG. 6 illustrates a table 628 illustrating a number of different selectable read trim sets corresponding to different programming process page mapping types in accordance with a number of embodiments of the present disclosure. The table 628 is an example of read trim set information that may correspond to read trim information 234 shown in FIG. 2. Column 643 illustrates four different programming process types, which may each have different corresponding page mappings.

For example, memory cells of memory units, such as memory units 233 shown in FIG. 2, may be configured as SLC or MLC cells. The MLC configurations may be 2-bit, 3-bit, or 4-bit configurations, for instance. The page mapping (e.g., programming order of pages) may vary based on the particular MLC configuration. Additionally, the programming processes corresponding to a particular MLC may vary. For example, a 3-bit MLC configuration may be programmed in accordance with a one-pass, two-pass, or three-pass programming process. Accordingly, the read trim sets used to read a particular page may depend on the cell type (e.g., SLC or one of a number of different MLC types) as well as on the particular programming process used to program the page.

In addition, as described herein, it may be beneficial to adjust a particular read trim set used to read a particular page depending on, for example, whether the particular page is a partially written page, whether the particular page is a last written page in a partially written superblock, and/or whether the particular page is adjacent to a last written page in a partially written superblock. In a number of embodiments of the present disclosure, an internal controller (e.g., 220) of a memory device (e.g., 243) may be configured to select, from among of a number of different read trim sets, an appropriate read trim set for reading a particular page based on internally maintained page map information and internally maintained last written page status information.

In the table 626 shown in FIG. 6, column 634 indicates a number of different read trim sets corresponding to the respective programming process page mapping types shown in column 643. For instance, T1 may be a first read trim set used to read SLCs of a last written page of a partially written superblock, and T2 may be a second read trim set used to read SLCs of pages within a partially written superblock which are not the last written page or not adjacent to the last written page. T3, T4, and T5 may be read trim sets used to read cells of type MLC1, which may correspond, for example, to 2-bit MLC cells programmed in accordance with a 2-4 two-pass programming process. T3 may be a first read trim set used to read pages written to cells that do not store a last written page and are not adjacent to partially programmed cells storing the last written page, T4 may be a second read trim set used to read pages written to cells that store the last written page and are adjacent to partially programmed cells (e.g., such that the last written page being read has experienced some interference due to programming of the adjacent cells), and T5 may be a third read trim set used to read pages written to cells that store the last written page and are adjacent to unprogrammed cells (e.g., such that the last written page being read has not experienced interference due to programming of the unprogrammed adjacent cells).

T6, T7, and T8 may be read trim sets used to read cells of type MLC2, which may correspond, for example, to 3-bit MLC cells programmed in accordance with a 4-8 two-pass programming process. T6 may be a first read trim set used to read pages written to cells that do not store a last written page and are not adjacent to partially programmed cells storing the last written page, T7 may be a second read trim set used to read pages written to cells that store the last written page and are adjacent to partially programmed cells, and T8 may be a third read trim set used to read pages written to cells that store the last written page and are adjacent to unprogrammed cells. T9, T10, and T11 may be read trim sets used to read cells of type MLC3, which may correspond, for example, to 3-bit MLC cells programmed in accordance with a 2-8 two-pass programming process. T9 may be a first read trim set used to read pages written to cells that do not store a last written page and are not adjacent to partially programmed cells storing the last written page, T10 may be a second read trim set used to read pages written to cells that store the last written page and are adjacent to partially programmed cells, and T11 may be a third read trim set used to read pages written to cells that store the last written page and are adjacent to unprogrammed cells.

A number of embodiments of the present disclosure include maintaining page map information (e.g., 231) and read trim set information (e.g., 234) internal to a memory device (e.g., 243), which may provide various benefits. For example, the internal controller (e.g., 220) of the memory device may adapt to different programming process page mapping types without requiring reconfiguration information from an external controller (e.g., system controller 218 or a host such as host 102). For instance, since the internal controller may access page map information such as that shown in FIG. 2, the internal controller may select appropriate read trims for reading partially written blocks for a variety of different cell types and/or programming process types without having to obtain additional read trim settings from external sources, for instance.

FIG. 7 illustrates a table illustrating examples of particular superblocks of memory cells of a multiplane memory device 342 combined into superblocks 746 in accordance with a number of embodiments of the present disclosure. Groups of memory cells may be organized as a number of physical blocks in accordance with a number of embodiments of the present disclosure. As one example illustrated in FIG. 7, the number of physical blocks may be organized as blocks in a number of planes 745. For example, the blocks may be blocks 0, 4, ..., 8188 in plane 0 at 343-0, blocks 1, 5, ..., 8189 in plane 1 at 343-1, blocks 2, 6, ..., 8190 in plane 2 at 343-2, and blocks 3, 7, ..., 8191 in plane 3 at 343-3 of a multiplane memory device 342.

The table illustrated in FIG. 7 shows a number of example superblocks 746 that combine one block from each of planes 0, 1, 2, and 3, shown at 745, that have been utilized, or may potentially be utilized, to form an open superblock in a programming operation (e.g., a write operation). The superblocks (e.g., superblocks 0, 1, ..., 8) may be subject to performance of partially written superblock treatment operations, as described herein, to determine an appropriate read trim for each superblock (e.g., as shown at 634 and described in connection with FIG. 6).

In a number of examples, various combinations of blocks may be combined to form a superblock. FIG. 7 illustrates a few of these examples; however, embodiments of the present disclosure are not limited to the configuration of the superblocks shown in FIG. 7. For example, as shown at 745, superblock 0 is shown to include block 0, block 5, block 6, and block 7, in corresponding planes 0, 1, 2, and 3. Superblock 1 is shown to include block 4, block 9, block 10, and block 11, in corresponding planes 0, 1, 2, and 3. Among other superblocks, the table also shows superblock 8 to include block 816, block 817, block 818, and block 819, in corresponding planes 0, 1, 2, and 3.

The number of combinations of blocks 745 that form the superblocks 746 is shown to be nine in FIG. 7; however, embodiments are not limited to a particular number of superblocks being listed in the table. For example, as indicated by the ellipses in the table, any combination of the blocks 0, 1, ..., 8191 from the appropriate planes 0, 1, 2, and 3 at 745 may be listed in the table. In addition, the superblocks are listed as superblock numbers 0, 1, ..., 8 for clarity. However, as indicated by the ellipses between superblocks 3 and 4 and superblocks 5 and 6, there can be any number of superblocks between these consecutively listed superblocks, and after superblock 8, which may affect the numbering sequence and/or the total number of superblocks.

FIG. 8 illustrates a table illustrating examples of an open block list 850 maintained internal to the multiplane memory device in accordance with a number of embodiments of the present disclosure. As described herein, an open block may refer to a physical block of memory cells in which, responsive to receipt of a request to direct initiation of a programming operation to a word line coupled to the block, an indicator (e.g., an entry) of the initiated programming operation is stored to document that the block is open. In a number of embodiments, the block and/or superblock may remain open until a last page in the block and/or the superblock is programmed, a request (e.g., a write command from system controller 118 via device controller 120) is received to direct initiation of a programming operation to a first page of an already programmed block and/or superblock, and/or a command is received to remove (e.g., erase) a particular entry for a block and/or superblock. In a number of embodiments, a command to remove a number of entries may be received from the system controller 118 via the device controller 120 utilizing a set features interface (e.g., as shown at 119 and 1019 and described further in connection with FIG. 10).

The memory device system 104 may be configured to maintain, in the open block list 850 internal to the memory device system 104, a status of a number of open blocks in the memory device system 104. The status may include that a programming operation has been initiated in the number of open blocks by the particular blocks being listed in the open block list (e.g., in response to receipt of a request to direct initiation of the programming operation to a word line).

As described herein, the open block list 850 and/or the open superblock list 922 illustrated in FIG. 9 may include, in a number embodiments, a number of entries 854, 964, respectively, that may be stored therein until removed. As one example, the open block list 850 illustrated in FIG. 8 and/or the open superblock list 922 illustrated in FIG. 9 may allow (e.g., be limited to) four entries (e.g., entry 0, entry 1, entry 2, and entry 3; however, embodiments of open block lists and/or open superblock lists are not limited to the number of entries shown in FIGS. 8 and 9). For example, an open block list and/or an open superblock list may be configured to allow 4, 8, 16, 32, etc., open block entries, among other possible numbers of entries. The number of entries in the open block list and/or the open superblock list may be determined by available area in the memory device and/or a controller thereof, complexity, and/or cost thereof, among other considerations.

An example open block list 850 illustrated in FIG. 8 may, in a number of embodiments, be maintained internal to a memory device system 104 that includes, and/or internal to a device controller (e.g., device controller 120 shown in memory device system 104 and described in connection with FIG. 1) that is associated with (e.g., coupled to), a multiplane memory device (e.g., LUN 342 shown in and described in connection with FIG. 3). Each block 851 entered into the open block list 850 may have an indicator of a last written page 852 associated with the block. For example, the last written page 852 for block 0 at 855 may be page 1 of block 0. By way of example, the last written pages 852 for blocks 5, 6, and 7 of a superblock also may be page 1 of the respective blocks.

The open block list 850 may list a number of open blocks 851, which at any point in time, depending on the programming activity LUN 342, may correspond to no open superblocks, one open superblock (e.g., superblock 0, 5, 6, 7 as shown in FIG. 8), or a plurality of open superblocks. In the example shown in FIG. 8, the open block list 850 may be limited to four entries 854. The separate entries for blocks 0, 5, 6, and 7, along with the corresponding last written pages 852, may be utilized in situations where a superblock has not been formed from combination of the blocks. The separate last written page indicators 852 may be utilized in such a situation in determination of an appropriate read trim for each individual block 0, 5, 6, and 7.

However, when blocks 0, 5, 6, and 7 are combined as a superblock (e.g., superblock 0 shown in FIG. 7), there is only one last written page 852 (e.g., as indicated by page 1 being listed for each of blocks 0, 5, 6, and 7) for the single superblock. When, for example, the open block list 850 is limited to four entries 854, and that number of entries corresponds to the number of blocks (e.g., blocks 0, 5, 6, and 7) and/or the number of planes 343 in a single superblock, a limited number of (e.g., only one) superblocks (e.g., including all the blocks of superblock 0) may be entered into the open block list at any point in time.

When a read request is submitted (e.g., by the system controller 118 through the device controller 120) for a block other than a block entered in the open block list 850, the system controller 118 and/or the device controller 120 would be presented with a decision. Because information concerning the block (e.g., the last written page thereof) is not entered in the open block list 850, the information is unavailable for determination of an appropriate read trim, as described herein. As such, such information may be retrieved (e.g., from memory associated with the system controller 118 or elsewhere) for entry into the open block list 850.

Because block 4 at 856 may be a fifth block and the open block list 850 may be limited to four entries 854, an entry of the information, including the last written page thereof 852, concerning block 4 at 856 may replace a previous entry in the list. For example, the entry 0 at 854 concerning block 0 at 855 (e.g., forming part of superblock 0) may be removed to enable a substitute entry 0 for block 4 at 856. Doing so may result in information for all of the blocks of open superblock 0 no longer being present in the open block list 850. In addition, block 4 may be part of another open superblock (e.g., superblock 1 shown in FIG. 7) and only a portion of the information for that superblock would be entered into the open block list 850.

FIG. 9 illustrates a table illustrating examples of an open superblock list 922 maintained internal to the multiplane memory device in accordance with a number of embodiments of the present disclosure. In contrast to the open block list 850 described in connection with FIG. 8, the open superblock list 922 includes indicators (e.g., entries shown at 964) corresponding to open superblocks 961 instead of open blocks 851, which may or may not be included in an open superblock. A particular entry 964 may correspond to a status of the corresponding superblock 961 by the indicator in the open superblock list 922 indicating that that the superblock is open, where the status also may include the indicator 962 of the last written page. In a number of embodiments, the status also may include a page address of the last written page corresponding to the partially written superblock.

Each superblock 961 in the open superblock list 922 may be associated with an entry number 964 (e.g., entry 0, entry 1, entry 2, and entry 3; although embodiments are not limited to four entries). At any point in time, there may be up to as many open superblocks entered in the open superblock list 922 as correspond to the number of entries enabled by the list. For example, blocks 0, 5, 6, 7 shown as superblock 0 in FIG. 7 may be entered as entry 0 at 964, blocks 4, 9, 10, 11 shown as superblock 1 may be entered as entry 1, blocks 8, 1, 2, 3 shown as superblock 2 may be entered as entry 2, and blocks 12, 13, 14, 15 shown as superblock 3 may be entered as entry 3, among possible additional superblock entries. An indicator of a single last written page 962 may be entered for each superblock 961 for determination of an appropriate read trim for each corresponding superblock, as described herein. In various situations (e.g., as described in connection with the set features interface shown at 1019 in FIG. 10), an entry regarding a particular superblock 966 may be removed from the open superblock list 922 (e.g., in response to a last page of an open superblock being programmed (written), thereby causing the superblock to no longer be open, among other possible reasons for removal from the list).

Hence, embodiments described herein provide a method for treatment of partially written superblocks. An example of such a method may include receiving, from an external controller (e.g., system controller 118), a write command to a memory device (e.g., multiplane memory device 342) including an array of memory cells formed as a plurality of blocks (e.g., blocks 439 shown and described in connection with FIG. 4), where initiation of the write command results in a number of superblocks being opened (e.g., superblocks 961 shown and described in connection with FIG. 9). The method may include maintaining, internal to the memory device, a status of a number of open superblocks in the memory device. The status may include an indicator of a write operation being partially written in the respective number of open superblocks (e.g., as indicated by the open superblock being recorded as an entry in and/or at PWS 237 and/or 961), an indicator of a last written page in a block of an open superblock (e.g., as indicated at LWP 235 and/or at 962), and/or page map information (e.g., as indicated at 231) including a page programming order.

The method may include, prior to a remainder of the open superblock being written, receiving a read request from the external controller, the read request including an identifier of each block of the open superblock (e.g., as shown at 961 and described in connection with FIG. 9) and a page identifier (e.g., physical address). The method may include comparing the identifier of each block to the maintained status of the open superblock. The method may include, responsive to determining that the identifier of each block matches the maintained status of the open superblock, determining, from the page map information and the indicator of the last written page maintained internal to the memory device, which of a number of different read trim sets (e.g., as shown at 634 and described in connection with FIG. 6) to use to read the page corresponding to the read request.

The method may further include that maintaining the indicator of the last written page in the superblock internal to the memory device replaces the memory device receiving the indicator from the external controller in association with the read request. Based upon the indicator of the last written page being maintained internal to the memory device, the internal SSD controller (e.g., device controller 122) may determine, based on the status of the number of open superblocks, which of the number of different read trim sets to use to read the page corresponding to the read request.

The method may further include storing the indicator of the last written page in the open superblock as the status of the open superblock in an open superblock list (e.g., as shown at 962 in open superblock list 922). Storing the one indicator of the last written page in the open superblock may enable replacing storage of a plurality of last written pages corresponding to a respective plurality of blocks (e.g., as shown at 852 in open block list 850) that forms the open superblock with the indicator of the last written page in the open superblock.

The method may further include automatically adding a first entry (e.g., entry 0 in column 964 corresponding to superblock 965 shown and described in connection with FIG. 9), including the identifier of each block of the open superblock corresponding to the write command, to the open superblock list 922 internal to the memory device in responsive to initiation of the write command to the memory device. The open block list 922 may allow only a particular number of entries (e.g., four entries 964 as shown by way of example and not by way of limitation). The method may further include automatically removing a second entry (e.g., entry 0 in column 964 corresponding to superblock 966, which may be the same entry as superblock 965) from the open superblock list upon occurrence of either the write command being issued to a first page of a word line corresponding to the entry (e.g., the superblock being rewritten from the first page) and/or execution of the write command results in performance of the write operation from the first page through a last page of the superblock (e.g., the superblock being fully written from the first page to the last page). The method may further include automatically adding the first entry to the open superblock list in place of the removed second entry (e.g., in response to the first and second entries being for different superblocks).

The method may further include issuing, from the external controller, a write command to a page of a word line corresponding to the open superblock, adding an address of the page as the last written page to a status of an entry in an open superblock list in the memory device. The method may further include issuing, from the external controller, a read request to a different page of the word line corresponding to the open superblock (e.g., a neighboring page in the same block or in a different block of the superblock) and automatically applying the status of the last written page 962 of the entry in the open superblock list 922 to determine which of the number of different read trim sets to use to read the page corresponding to the read request. For example, the status of the last written page (e.g., address) dynamically updated during a programming operation (e.g., a write operation) may be utilized to determine which of the number of different read trim sets 634 to use to read other pages in the same block or in a different block of the superblock corresponding to the identifier of each block of the open superblock included in the read request.

FIG. 10 illustrates a table illustrating an example of a set features interface 1019 maintained internal to a host 102 in accordance with a number of embodiments of the present disclosure. As shown at 119 and described in connection with FIG. 1, the set features interface 1019 internal to the host 102 may be associated with (e.g., formed as part of) the system controller 118.

In contrast to the device controller 120 internal to the memory device system 104 being configured to, for example, actively direct tracking of last written pages of partially written superblocks for determination of an appropriate read trim, as described herein, the set features interface 1019 of the system controller 118 may be configured instead to monitor and/or control such operations. In a number of embodiments, the table of the set features interface 1019 shown in FIG. 10 may include a number of features 1071, with a number of the features having a plurality of options 1072. The features 1071 and/or options 1072 in the set features interface 1019 may be selectably enabled (e.g., applied) via input of commands. The commands may, in various embodiments, be input from processor 105, memory and bus control 107, peripheral and bus control 109, host memory 116, system controller 118, and/or a user (not shown), among other possibilities.

An example of a feature 1071 in the set features interface 1019 may be direction of removal 1073 of a superblock from the open superblock list (e.g., as shown at 966 and described in connection with FIG. 9). Such removal may be selectably enabled (e.g., directed) to, in a number of embodiments, particular data buses 332 (e.g., DQ 0, DQ 1, . . . , DQ 7 shown at 1032) and associated page, block, superblock, and/or word line addresses.

For example, removal 1073 of superblocks optionally may not be enabled 1074 (e.g., as a default option 1072) concerning data buses DQ 6 and DQ 7 from the open superblock list 922. Not enabling an option may be achieved by entry of a 0 data value for particular data buses in the set features interface 1019 or leaving an entry unchanged from a default value. Removal of selected superblocks 1075 from the open superblock list 922 is another option 1072 that may be enabled. For example, removal of selected superblocks may be enabled (e.g., by entry of a 1 data value) for DQ 7 and may be disabled (e.g., by entry of a 0 data value) for DQ 6. Removal of all superblocks 1076 from the open superblock list 922 is another option 1072 that may be enabled. For example, removal of all superblocks may be enabled (e.g., by entry of a 1 data value) for DQ 6 and may be disabled (e.g., by entry of a 0 data value) for DQ 7.

Another example of a feature 1071 in the set features interface 1019 may be a direction to read 1078 a status of the open superblock list 922. Reading of such a status may be selectably enabled (e.g., directed) to, in a number of embodiments, particular DQs (e.g., DQ 0, DQ 1, . . . , DQ 7 shown at 1032) and associated page, block, superblock, and/or word line addresses. For example, an option 1080 (e.g., a default option) may be to read a status of the open superblock list 922 when a number of entries are still available (e.g., based on the allowed number of entries not yet being utilized). The default option may be achieved by entry of a 0 data value (e.g., as directed by device controller 120) for particular data buses in the set features interface 1019 or leaving an entry unchanged from a default value. For example, DQ 7 has the default option enabled. Another option 1081 that may be enabled is to read a status of the open superblock list 922 when all the allowed entries are utilized. This option may be achieved, for example, by entry of a 1 data value for DQ 7 (e.g., as directed by device controller 120). In a number of embodiments, system controller 118 may access (e.g., read) the status of the open superblock list 922 based upon either of the options just described being enabled by the device controller 120.

Another option 1083 that may be enabled is for addition of an entry to the open superblock list 922. In a number of embodiments, information concerning a new superblock (e.g., not already entered into the open superblock list 922) may be entered in a number of situations. For example, a superblock may be entered into the open superblock list 922 when a previous entry is removed (e.g., as shown at 966), thereby creating an opening for the new entry. This option may be achieved, for example, by entry of a 1 data value for DQ 7 (e.g., as directed by device controller 120). A superblock may be entered into the open superblock list 922 when directed by the system controller 118 (e.g., as described in connection with block 4 at 855 being added to the open block list 850 shown and descried in connection with FIG. 8). In a number of embodiments, a number of entries allowed in the open superblock list 922 may be increased (e.g., by increasing storage capacity of allocated memory) to enable addition of more superblocks into the open superblock list 922.

Other features 1071 and/or options 1072 may be available in the set features interface 1019 (e.g., as indicated by "reserved"). In addition, more than one set features interface 1019 and/or open superblock list 922 may be maintained for a computing system 100. For example, in a number of embodiments, a plurality of set features interfaces 1019 and/or open block lists 850 and/or superblock lists 922 may be maintained when the memory device system 104 includes a plurality of volatile memory resources 124 and/or non-volatile memory resources 124.

Accordingly, as described herein, a system controller 118 may be coupled to the host 102 via a host interface 106. A memory device (e.g., multiplane memory device 342) may be coupled to the controller 118 via a device interface 108. The memory device 342 may, in a number of embodiments, include a plurality of superblocks. The system controller 118 may be configured to direct initiation of a write operation to a page associated with a word line of a block included in an open superblock that is partially written, as described herein. The memory device 342 may include a plurality of superblocks each including a plurality of blocks configured to store pages of data. The memory device 342 (e.g., a device controller 120 thereof) may be configured to determine a particular page of the open superblock as being a last written page of the open superblock. Based at least partially on the last written page, the memory device 342 (e.g., the device controller 120 thereof) may determine which of a number of different read trim sets 634 to use to read the page of the open superblock corresponding to a read request from the system controller 118.

The memory device 342 may be further configured to maintain, internal to the memory device, a status of a number of open superblocks in the memory device. The status may include that a write operation has been initiated in the respective number of open superblocks (e.g., as recorded by the PWS 237 in the memory device) and a page address of the LWP 234 corresponding to the partially written superblock. The status of the number of open superblocks in the memory device may be recorded by open superblock list 922 (e.g., by each of the number of open superblocks appearing as an entry 964 in the open superblock list 922 shown in and described in connection with FIG. 9) that includes the address of the last written page 962 of the open superblock (e.g., as stored in the open block list 922).

The system controller 118 and/or the device interface 108 may include a set feature interface 119, 1019 that is configured to direct removal (e.g., as shown at 1073 and described in connection with set feature interface 1019) of an entry 964 in the open superblock list 922 maintained internal to the memory device, where the entry may include the address of the last written page 962 of the open superblock. The set feature interface 1019 may be configured to direct updating an entry in an open superblock list maintained internal to the memory device. For example, the identity of each the open superblocks in the open superblock list 922 may change dependent upon which superblocks of the memory device 342 are open (e.g., being accessed for a read operation) at any point in time. Further, the identity of which page of a block and/or a superblock is the last written page may change dependent upon progress of a programming operation being performed on pages of the block and/or a superblock. As such, the device controller 120 may direct update of such status information, among other status information described herein, recorded in the open superblock list 922. The entry 964 may include the address of the last written page of the open superblock. In a number of embodiments, the address of the last written page may be updated in response to determining that the read request from the system controller 118 includes an appropriate identifier for each block in the open superblock (e.g., as shown at 961 and described in connection with the open superblock list 922) corresponding to the address of the last written page.

The device controller 120 may be an SSD controller internal to a memory device 243 in the memory device system 104 (e.g., multiplane memory device 342). The device controller 120 may be configured to track open superblocks corresponding to pages of the memory device and dynamically update an address of a particular page of a tracked open superblock as being a last written page of the open superblock. The device controller 120 may be further configured to determine, based on the updated address of the last written page, which of the number of different read trim sets to use to read the page of the open superblock.

In a number of embodiments, the memory device may be an SSD operable as a non-volatile multiplane memory resource (e.g., as shown at 342). The multiplane memory resource may include blocks organized as a superblock (e.g., as shown at 341). Such a superblock may include a first block in a first plane (e.g., 343-0) as a first page group associated with the word line and a second block in a second plane (e.g., 343-1) as a second page group associated with the word line. The first block in the first plane and the second block in the second plane may perform read operations concurrently as directed by the SSD controller internal to the memory device (e.g., device controller 120). The first page group in the first plane the second page group in the second plane are an example of a superblock described herein, although blocks in more than two planes may be combined to form a superblock (e.g., as shown with four planes in FIG. 3). The memory device (e.g., the device controller 120 thereof) may be further configured to utilize the last written page in the first plane or the second plane of the open superblock to determine which of the number of different read trim sets to use to read the page of the read request in response to determining that the requested page is in either one of the first plane and the second plane.

The system controller 118 coupled to the host 102 may be a system SSD controller that is further coupled via a bus 232 to the internal SSD device controller 120 of the memory device. However, the system controller 118 may not be configured to track open superblocks corresponding to pages of the memory device and/or to update the status of an open superblock to include the page address (e.g., an indicator of the page address) of the last written page corresponding to the open superblock.

Although specific embodiments have been illustrated and described herein, those of ordinary skill in the art will appreciate that an arrangement calculated to achieve the same results may be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
   a memory device operable as a multiplane memory resource comprising blocks organized as superblocks;
   wherein the memory device includes instructions stored thereon that when executed by a controller, internal to the memory device, cause the controller to direct the memory device to:
   maintain, internal to the memory device, a status of a number of open superblocks in the memory device, the status comprising an indicator of a write operation initiated in the number of the open superblocks; and responsive to receipt, by the controller, of a read request to a page of an open superblock, determine from page map information maintained internal to the memory device and from an indicator of a last written page of the open superblock, which of a number of different read trim sets to use to read the page of the open superblock corresponding to the read request.

2. The apparatus of claim 1, wherein the controller further directs the memory device to maintain, included in the status of the open superblock, the indicator corresponding to the last written page of the open superblock.

3. The apparatus of claim 1, wherein:
the read request received by the controller comprises an identifier of each block of the open superblock and a page identifier; and
the memory device accesses the page map information maintained internal to the memory device and the indicator of the last written page responsive to determining that the page identifier corresponds to a block included in the identifier of each block of the open superblock.

4. The apparatus of claim 1, wherein:
the status of the last written page includes a page number corresponding to the last written page;
the page map information includes a programming order of pages written to the open superblock; and
which of the number of different read trim sets to use to read the page of the open superblock is determined based on at least one of:
whether memory cells to which the page is written are fully programmed; and
a programming status of memory cells coupled to an access line adjacent to an access line to which the page is written.

5. The apparatus of claim 1, wherein the page map information maintained internal to the memory device comprises page map information corresponding to a number of different programming process page mappings including at least two different two-pass programming process page mappings.

6. The apparatus of claim 1, wherein:
the memory device is a NAND Flash memory device comprising the internal controller; and
the internal controller determines which of the number of different read trim sets to use to read the page of the open superblock corresponding to the read request.

7. An apparatus, comprising:
a memory device coupled to a controller, internal to the memory device, the memory device comprising a plurality of superblocks;
wherein the memory device includes instructions stored thereon that when executed by the controller cause the controller to direct the memory device to:
initiate a write operation to a page associated with a block included in an open superblock; and
determine, based on a last written page of the open superblock, which of a number of different read trim sets to use to read the page of the open superblock corresponding to a read request received by controller.

8. The apparatus of claim 7, wherein:
the memory device maintains, internal to the memory device, a status of a number of open superblocks in the memory device, the status comprising:
an indicator of an initiated write operation in the number of open superblocks; and
an indicator of a page address of the last written page corresponding to the open superblock.

9. The apparatus of claim 7, wherein a status of a number of open superblocks in the memory device comprises an open superblock list that includes the address of the last written page of the open superblock.

10. The apparatus of claim 7, wherein the memory device comprises:
a set feature interface to direct removal of an entry in an open superblock list maintained internal to the memory device;
wherein the entry includes the address of the last written page of the open superblock.

11. The apparatus of claim 7, wherein the memory device comprises:
a set feature interface to direct updating an entry in an open superblock list maintained internal to the memory device; wherein:
the entry includes the address of the last written page of the open superblock; and
the address of the last written page is updated in response to determining that the read request includes an appropriate identifier for each block in the open superblock corresponding to the address of the last written page.

12. The apparatus of claim 7, wherein the memory device comprises:
an internal solid state device (SSD) controller to direct the memory device to:
track open superblocks corresponding to pages of the memory device;
dynamically update an address of a particular page of a tracked open superblock as being a last written page of the open superblock; and
determine, based on the updated address of the last written page, which of the number of different read trim sets to use to read the page of the open superblock.

13. A method comprising:
receiving, by a memory device comprising a plurality of blocks, a read request including an identifier of each block of an open superblock and a page identifier;
comparing the identifier of each block to a maintained status of the open superblock; and
responsive to determining that the identifier of each block matches the maintained status determining, from page map information comprising a page programming order and an indicator of a last written page of the open superblock maintained internal to the memory device, which of a number of different read trim sets to use to read a page corresponding to the read request.

14. The method of claim 13, further comprising:
prior to a remainder of the open superblock being written, receiving a write command to the memory device, wherein initiation of the write command results in a number of superblocks being opened;
maintaining, internal to the memory device, a status of a number of open superblocks, the status comprising:
an indicator of a write operation being partially written in the respective number of open superblocks;
the indicator of the last written page in the block of the open superblocks; and the page map information comprising the page programming order.

15. The method of claim 13, wherein:
the memory device is a multiplane memory device comprising an internal SSD controller; and
the method includes determining, via the internal SSD controller based on a status of a number of open superblocks, which of the number of different read trim sets to use to read the page corresponding to the read request.

16. The method of claim 13, further comprising:
storing the indicator of the last written page in the open superblock as a status of the open superblock in an open superblock list; and
replacing storage of a plurality of last written pages corresponding to a respective plurality of blocks that forms the open superblock with the indicator of the last written page in the open superblock.

17. The method of claim 13, further comprising automatically adding a first entry, including the identifier of each block of the open superblock corresponding to a write command, to an open superblock list internal to the memory device responsive to initiation of the write command to the memory device.

18. The method of claim 17, further comprising:
the open superblock list allowing a particular number of entries; and
automatically removing a second entry from the open superblock list upon occurrence of either:
the write command is issued to a first page of a word line corresponding to the entry; and
execution of the write command results in performance of the write operation from the first page through a last page of the superblock.

19. The method of claim 18, further comprising automatically adding the first entry to the open superblock list in place of the removed second entry.

20. The method of claim 13, further comprising:
adding an address of the page as the last written page to a status of an entry in an open superblock list in the memory device;
receiving a read request to a different page of the word line corresponding to the open superblock; and
automatically applying the status of the last written page of the entry in the open superblock list to determine which of the number of different read trim sets to use to read the page corresponding to the read request.

* * * * *